(12) United States Patent
Ma (10) Patent No.: US 10,580,661 B2
(45) Date of Patent: Mar. 3, 2020

(54) ATOMIC LAYER ETCH PROCESS USING PLASMA IN CONJUNCTION WITH A RAPID THERMAL ACTIVATION PROCESS

(71) Applicants:Mattson Technology, Inc., Fremont, CA (US); Beijing E-Town Semiconductor Technology, Co., LTD, Beijing (CN)

(72) Inventor: Shawming Ma, Sunnyvale, CA (US)

(73) Assignees: MATTSON TECHNOLOGY, INC., Fremont, CA (US); BEIJING E-TOWN SEMICONDUCTOR TECHNOLOGY, CO., LTD, Beijing (CN)

(*) Notice: Subject to any disclaimer, the term of this patent is extended or adjusted under 35 U.S.C. 154(b) by 0 days.

(21) Appl. No.: 15/582,896

(22) Filed: May 1, 2017

(65) Prior Publication Data
US 2018/0166296 A1    Jun. 14, 2018

Related U.S. Application Data

(60) Provisional application No. 62/434,036, filed on Dec. 14, 2016.

(51) Int. Cl.
*H01L 21/311* (2006.01)
*H01L 21/3105* (2006.01)
*H01J 37/32* (2006.01)

(52) U.S. Cl.
CPC .. *H01L 21/31138* (2013.01); *H01J 37/32357* (2013.01); *H01J 37/32422* (2013.01);
(Continued)

(58) Field of Classification Search
CPC .......... H01L 21/31138; H01L 21/31058; H01J 37/32449; H01J 37/32357;
(Continued)

(56) References Cited

U.S. PATENT DOCUMENTS 5,302,240 A    4/1994    Hori et al.
5,789,320 A    8/1998    Andricacos et al.
(Continued)

FOREIGN PATENT DOCUMENTS

EP    0376252    7/1990
JP    01081318 A  *  3/1989  ............. H01L 21/30

OTHER PUBLICATIONS

JP 6481318 English translated Abstract (1989).*
(Continued)

*Primary Examiner* — Nadine G Norton
*Assistant Examiner* — Mahmoud Dahimene
(74) *Attorney, Agent, or Firm* — Dority & Manning, P.A.

(57) ABSTRACT

A process for etching a film layer on a semiconductor wafer is disclosed. The process is particularly well suited to etching carbon containing layers, such as hardmask layers, photoresist layers, and other low dielectric films. In accordance with the present disclosure, a reactive species generated from a plasma is contacted with a surface of the film layer. Simultaneously, the substrate or semiconductor wafer is subjected to rapid thermal heating cycles that increase the temperature past the activation temperature of the reaction in a controlled manner.

18 Claims, 3 Drawing Sheets

(52) U.S. Cl.
CPC .. *H01J 37/32449* (2013.01); *H01J 37/32724* (2013.01); *H01L 21/31058* (2013.01); *H01J 2237/2001* (2013.01)

(58) Field of Classification Search
CPC ........... H01J 37/32422; H01J 37/32724; H01J 2237/2001; H01J 2237/3341
See application file for complete search history.

(56) References Cited

U.S. PATENT DOCUMENTS

| | | | |
|---|---|---|---|
| 5,866,920 A * | 2/1999 | Matsumoto | H01L 21/31144 257/63 |
| 6,199,561 B1 * | 3/2001 | Mitsuhashi | H01L 21/31138 134/1.1 |
| 6,707,011 B2 | 3/2004 | Tay et al. | |
| 6,939,794 B2 | 9/2005 | Yin et al. | |
| 6,970,644 B2 | 11/2005 | Koren et al. | |
| 7,358,462 B2 | 4/2008 | Timans | |
| 7,807,064 B2 | 10/2010 | Kim et al. | |
| 7,977,245 B2 | 7/2011 | Xiao | |
| 8,383,519 B2 | 2/2013 | Nozawa et al. | |
| 8,617,411 B2 | 12/2013 | Singh | |
| 9,111,876 B2 | 8/2015 | Chang et al. | |
| 9,396,963 B2 | 7/2016 | Diao et al. | |
| 9,482,468 B2 * | 11/2016 | Camm | F27B 17/0025 |
| 2001/0005635 A1 * | 6/2001 | Kitagawa | H01L 21/31138 438/710 |
| 2003/0222319 A1 | 12/2003 | Azuma | |
| 2004/0259355 A1 | 12/2004 | Yin | |
| 2005/0042879 A1 | 2/2005 | Yin | |
| 2005/0167394 A1 | 8/2005 | Liu et al. | |
| 2005/0199262 A1 * | 9/2005 | Jeon | H01L 21/02063 134/1.1 |
| 2010/0210067 A1 | 8/2010 | Butcher | |
| 2011/0139748 A1 | 6/2011 | Donnelly et al. | |
| 2011/0226280 A1 * | 9/2011 | Berry | G03F 7/427 134/1.1 |
| 2013/0137267 A1 | 5/2013 | Chang et al. | |
| 2014/0216498 A1 | 8/2014 | Lee et al. | |
| 2015/0262834 A1 | 9/2015 | Belostotskiy et al. | |

OTHER PUBLICATIONS

Article—Lee et al., "A Novel SONOS Structure of $SiO_2/SiN/Al_2O_3$ with TaN Metal Gate for Multi-Giga Bit Flash Memeries," published in Electron Devices Meeting, 2003, IEDM '03 Technical Digest, IEEE International, Dec. 8-10, 2003, Washington DC, USA, 4 pages.

Article—Jang et al, "Vertical Cell Array Using TCAT (Terabit Cell Array Transistor) Technology for Ultra High Density NAND Flash Memory," published in VLSI Technology, 2009 Symposium, Jun. 16-18, 2009, Honolulu, HI, 2 pages.

Abstract of Korean Patent KR20120042045, May 3, 2012, 1 page.

PCT International Search Report & Opinion for corresponding PCT Application No. PCT/US2017/030350, dated Oct. 5, 2017—12 pages.

Shinoda et al., "Thermal cyclic etching of silicon nitride using formation and desorption of ammonium fluorosilicate," Published Sep. 9, 2016 • © 2016 The Japan Society of Applied Physics, Applied Physics Express, vol. 9, No. 10—4 pages.

Imai et al., "Atomic Layer Etching of Silicon by Thermal Desorption Method," Published Jun. 22, 1995, The Japan Society of Applied Physics, Japanese Journal of Applied Physics, vol. 34, Part 1, No. 9A — 6 pages.

PCT International Preliminary Report on Patentability for corresponding PCT Application No. PCT/US2017/030350, dated Jun. 18, 2019—8 pages.

* cited by examiner

ATOMIC LAYER ETCH PROCESS USING PLASMA IN CONJUNCTION WITH A RAPID THERMAL ACTIVATION PROCESS

RELATED APPLICATIONS

The present application is based on and claims priority to U.S. Provisional Patent application Ser. No. 62/434,036, filed on Dec. 14, 2016, which is incorporated herein by reference.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates.

One type of process carried out in the past using plasma is atomic layer etching. Atomic layer etching is a technique to perform critical etching with very fine precision for semiconductor device manufacturing. Atomic layer etching is performed on a thin layer while attempting to avoid undue sub-surface damage or undesirable modifications. Atomic layer etching may be performed to etch a very thin layer that overlays another critical layer. Atomic layer etching may also be employed at the end of an etch process for removing minor amounts of a remaining layer that was previously etched without damaging the underlying structures. It is desired to use atomic layer etching to have self-surface limited process reaction so uniformity is controlled by surface exposure only, not controlled by plasma uniformity anymore so the etch amount uniformity can be further improved.

In the past, atomic layer etching methods included first a surface reactive species attachment step followed by plasma ion bombardment to remove the reactive surface layer. Such ion bombardment control is only one aspect of the possible approach for the atomic layer etching. Traditional atomic layer etching has been very successful on films containing silicon, such as Si, $Si_3N_4$ or $SiO_2$. The above traditional method using ion bombardment activation, however, has not been successful on other layers, particularly layers containing carbon and other low dielectric films. These other materials, for instance, are less reactive to the ion bombardment and more to the chemical reaction. Further, in some embodiments, higher temperatures are needed in order for the etching process to occur which can result in very long etching cycles that provide little control over the process.

Consequently, a need exists for an etch method for etching carbon containing films and other similar films including films having a low dielectric constant. More particularly, a need exists for a method and process for performing an atomic layer etching process on the above materials.

SUMMARY

In general, the present disclosure is directed to a process and apparatus for carrying out a precision controlled etch on a layer, particularly on a layer contained on a semiconductor wafer. In accordance with the present disclosure, the process includes exposing a layer to a reactive species. The reactive species, for instance, can be generated by a plasma source. With the possible screening grid between the plasma source and the substrate, mostly reactive neutral will reach the substrate surface without ion bombardment. While the layer is exposed to the reactive species, the temperature of the layer is increased by exposing the layer to rapid thermal cycles. The rapid thermal cycles, for instance, can be produced by one or more pulsating lamps. The rapid thermal cycles are capable of incrementally increasing the temperature of the layer above the activation temperature needed for the reactive species to react with the layer. By carefully controlling the temperature increase in combination with the temperature increase duration, a controlled, precision etch is carried out as the reactive species reacts with the layer.

For example, in one embodiment, the present disclosure is directed to a process for etching a layer on a semiconductor wafer. The process includes the steps of placing a semiconductor wafer in a processing chamber. The semiconductor wafer includes a film layer. The film layer, for instances, may contain carbon. For instance, the film layer may comprise a low dielectric film, a photoresist layer, a hardmask layer, or the like. A plasma is generated from etchant gas. The plasma contains a reactive species. In accordance with the present disclosure, the film layer is contacted with the reactive species. In one embodiment, for instance, the plasma is generated in a plasma chamber and filtered through a filter structure prior to contacting the film layer. The filter structure includes openings that allow the reactive species to pass but filter out at least 65%, such as at least 80%, such as at least 90%, of charged species contained within the plasma. The reactive species, for instance, can comprise neutral particles.

As the film layer is being contacted with the reactive species, the semiconductor wafer is exposed to a rapid thermal cycle. The rapid thermal cycle heats the film layer above an activation temperature sufficient to cause the reactive species to etch the film layer. In one embodiment, for instance, the temperature of the film layer is incrementally increased by exposing the semiconductor wafer to multiple rapid thermal cycles. Each rapid thermal cycle can be the same length of time or can have different lengths of time. In one embodiment, the one or more rapid thermal cycles can be produced by one or more lamps, such as flash lamps. By exposing the semiconductor wafer to multiple rapid thermal cycles, the film layer can be incrementally etched in a controlled manner. For instance, in one embodiment, the process comprises an atomic layer etch process.

The temperature to which the film layer is heated, the concentration of the reactive species within the chamber, the duration of the thermal cycles, and the other parameters can be adjusted based upon the particular application and the desired result. In one embodiment, for instance, the film layer can be heated to a temperature of greater than about 80° C., such as greater than about 90° C., such as greater than about 100° C. For instance, the semiconductor wafer and/or the film layer can be heated to a temperature of from about 100° C. to about 300° C. during the process. The etchant gas can comprise a single gas or a mixture of gases. The etchant gas, for instance, can comprise molecular oxygen, molecular nitrogen, argon, molecular hydrogen, water, hydrogen peroxide, carbon dioxide, sulfur dioxide, methane, carbonyl sulfide, trifluoromethane, tetrafluoromethane, or mixtures thereof. During the process, the etch rate can be carefully controlled. For instance, the etch rate can be from about 100 Angstroms per minute to about 5000 Angstroms per minute.

Other features and aspects of the present disclosure are discussed in greater detail below.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

The present disclosure is generally directed to a process for etching the surface of a substrate, such as a semiconductor wafer. The present disclosure is also directed to an apparatus and system for carrying out the process. In accordance with the present disclosure, the surface of a substrate is contacted with the reactive species while being subjected to rapid thermal cycles. The rapid thermal cycles incrementally increase the temperature of the surface past an activation temperature at which the reactive species reacts with the surface and etches the surface removing a surface layer.

The process of the present disclosure is particularly well suited for atomic layer etching of certain substrates. For instance, the process of the present disclosure is particularly well suited to etching films containing carbon.

Atomic layer etching refers to an etching process in which a surface is etched by removal of individual atomic layers. Traditionally, atomic layer etching is a two-step process in which the surface of a substrate is reacted with a chemical component. After the reaction, the surface is subjected to plasma ion bombardment to remove the reacted surface layer. The above method, however, is not well suited to etching films containing carbon and other low dielectric constant materials. Such materials are less reactive to ion bombardment. In this regard, the present disclosure is directed to an alternative atomic layer etching method using thermal activation through thermal pulsing for precision etch amount control. Not only is the process of the present disclosure well suited to etching various materials, including carbon containing layers, but also can be carefully controlled in accordance with strict tolerances. By using short thermal pulsing, for instance, the reaction and etching can be stopped at each thermal pulsing cycle so the etched amount can be controlled to a very fine resolution.

The process of the present disclosure offers various advantages and benefits. For instance, by precisely controlling the etch amount of various different layers, improvements can be obtained in the underlying device being formed. For example, carbon containing films can be used in numerous and diverse applications and can be incorporated into a semiconductor device as a very thin layer which ultimately produces better electrical performance.

In accordance with the present disclosure, a wafer is placed in a processing chamber and subjected to a reactive species that can be generated from a plasma while also being exposed to one or more thermal cycles. In one embodiment, a downstream inductively coupled plasma (ICP) source can be utilized. However, the mask removal process of the present disclosure also contemplates other plasma technologies such as microwave downstream strip technology or parallel plate/inductively coupled plasma etch technologies. Inductive plasma sources are often used for plasma processing to produce high density plasma and reactive species for processing semiconductor substrates. For instance, inductive plasma sources can easily produce high density plasma using standard 13.56 MHz and lower frequency power generators.

Although in some embodiments, the substrate or semiconductor wafer can be directly exposed to a plasma, in one embodiment of the present disclosure, a plasma is produced downstream and filtered prior to contacting the substrate. In this regard, the plasma can be formed remotely from the processing chamber. After the plasma is formed, the desired particles or reactive species are channeled to the semiconductor substrate. For example, in one embodiment, a filter structure or grid can be used that is transparent to neutral particles that form the reactive species and not transparent to the plasma. Such processes can require high RF power, such as up to about 6000 watts, and in some cases relatively high gas flows and pressure. For instance, the gas flow rate can be about 20,000 standard cubic centimeters per minute and the pressure can be up to about 5,000 milliTorr.

Figure 1:
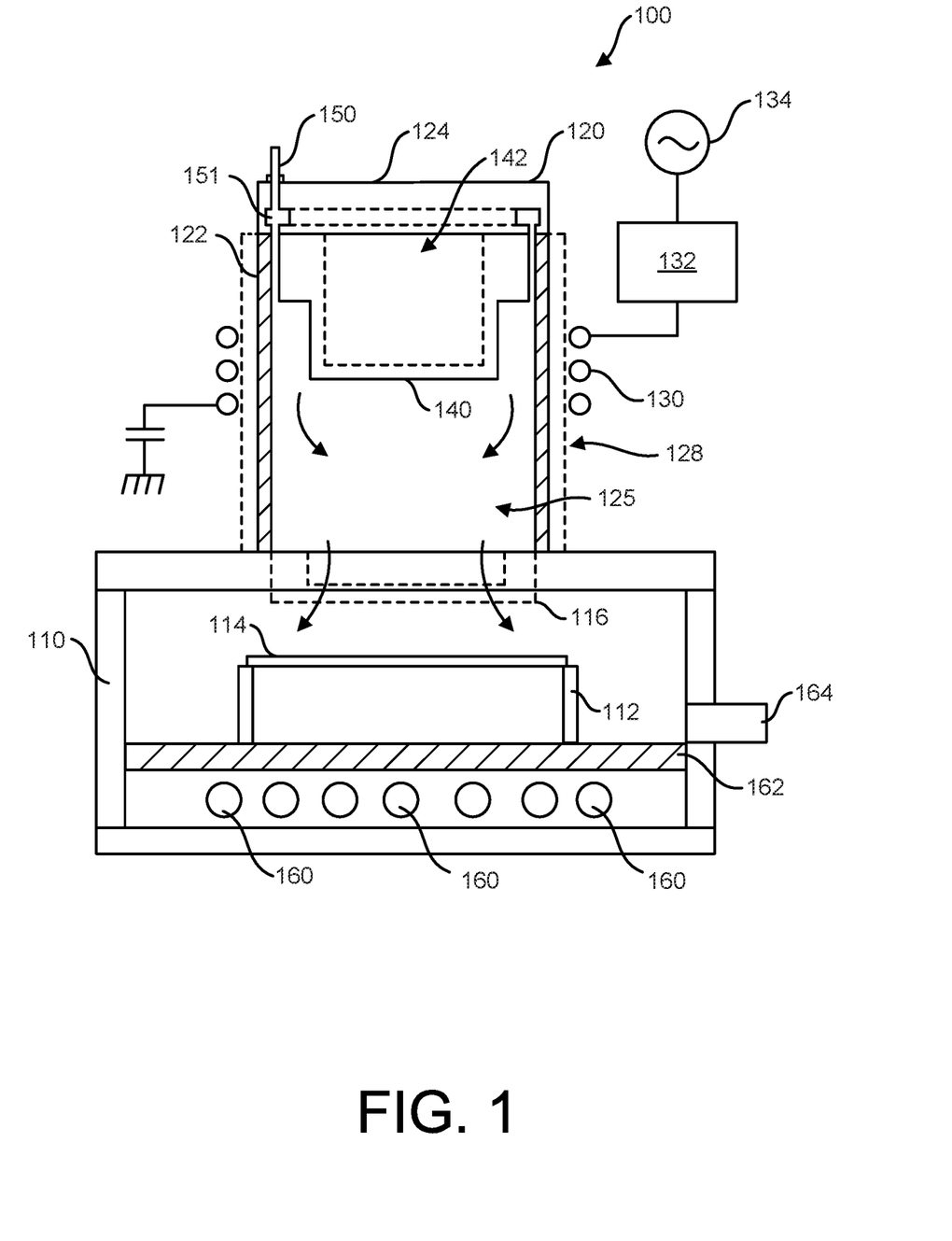
FIG. 1 is a cross sectional view of one embodiment of a processing system that may be used in order to carry out the process of the present disclosure and includes a plasma reactor, a processing chamber, and a plurality of heating lamps.

Referring to FIG. 1, one embodiment of a processing chamber 110 that may be used in accordance with the present disclosure is shown. The processing chamber 110 is in communication with a plasma reactor 100. In the embodiment illustrated, the processing chamber 110 is designed to hold a single semiconductor wafer. In other embodiments, however, a processing chamber can be used that can accommodate and process more than one wafer at a time. The processing chamber 110 is designed to accommodate a semiconductor wafer having a suitable diameter. The diameter of the wafer, for instance, can be from about 100 mm to about 500 mm in one embodiment. For example, the semiconductor wafer can have a diameter of 200 mm, a diameter of 300 mm, or a diameter of 450 mm. Fluid flow rates into and out of the processing chamber 110 can vary depending upon the size of the substrate being processed and whether more than one substrate is being processed at a time.

In the system illustrated in FIG. 1, the plasma reactor 100 includes a plasma chamber 120 that is separate from the processing chamber 110. The processing chamber 110 includes a substrate holder 112 operable to hold a substrate 114. An inductive plasma is generated in plasma chamber 120 (i.e., plasma generation region) and desired particles are then channeled from the plasma chamber 120 to the surface of substrate 114 through holes provided in a filter structure such as a grid 116 that separates the plasma chamber 120 from the processing chamber 110 (i.e., downstream region). The plasma chamber 120 includes a dielectric side wall 122 and a ceiling 124. The dielectric side wall 122 and ceiling 124 define a plasma chamber interior 125. Dielectric side wall 122 can be formed from any dielectric material, such as quartz. An induction coil 130 is disposed adjacent the dielectric side wall 122 about the plasma chamber 120. The induction coil 130 is coupled to an RF power generator 134 through a suitable matching network 132. Reactant and carrier gases can be provided to the chamber interior from gas supply 150 and annular gas distribution channel 151. When the induction coil 130 is energized with RF power from the RF power generator 134, a substantially inductive plasma is induced in the plasma chamber 120.

In a particular embodiment, the plasma reactor 100 can include an optional faraday shield 128 to reduce capacitive coupling of the induction coil 130 to the plasma. To increase efficiency, the plasma reactor 100 can optionally include a gas injection insert 140 disposed in the chamber interior 125. The gas injection insert 140 can be removably inserted into the chamber interior 125 or can be a fixed part of the plasma chamber 120. In some embodiments, the gas injection insert can define a gas injection channel proximate the side wall of the plasma chamber. The gas injection channel can feed the process gas into the chamber interior proximate the induction coil and into an active region defined by the gas injection insert and side wall. The active region provides a confined region within the plasma chamber interior for active heating of electrons. The narrow gas injection channel prevents plasma spreading from the chamber interior into the gas channel. The gas injection insert forces the process gas to be passed through the active region where electrons are actively heated.

The plasma generated in the plasma chamber 120, as described above, is passed through the filter structure of grid 116 and into the processing chamber 110. The grid 116 includes openings that allow the reactive species to pass but filter out the charged species. The reactive species, for instance, can comprise neutral particles. The top surface of the semiconductor wafer 114 is exposed to the reactive species which reacts and removes the surface of a film layer on the semiconductor substrate when the temperature of the film layer is above an activation temperature for the reaction.

In general, the grid 116 filters out at least about 65% of the charged species contained within the generated plasma. For instance, the filter structure or grid 116 can be configured to filter out at least about 70%, such as at least about 75%, such as at least about 80%, such as at least about 85%, such as at least about 90%, such as at least about 95% of the charged species contained within the plasma. In one particular embodiment, greater than about 98% of the charged species are filtered from the plasma so that the film layer on top of the semiconductor wafer is only contacted with the reactive species, such as the neutral particles.

As the film layer on the semiconductor wafer 114 is contacted with the reactive species, the semiconductor wafer is also exposed to one or more rapid thermal cycles. The rapid thermal cycles incrementally increase the temperature of the film layer to above the activation temperature of the reaction with the film layer and the reactive species. In general, any suitable heating device can be used to expose the semiconductor water to rapid thermal cycles. In the embodiment illustrated in FIG. 1, for instance, at least one lamp, such as a plurality of lamps 160 are used to heat the semiconductor wafer 114. Lamps 160 may comprise, for instance, flash lamps. The lamps, for instance, can be incandescent lamps, such as Tungsten-halogen lamps, arc lamps, or the like. The light sources 160 can be in operative association with a reflector or a set of reflectors for directing light energy being emitted by the lamps uniformly onto the wafer 114. In one embodiment, for instance, the lamps 160 may be designed to produce a uniform radiance distribution over a surface of the wafer.

The lamps can have any suitable configuration. In one embodiment, for instance, the lamps can include an axis that is parallel with or perpendicular to the semiconductor wafer 114. For instance, the lamps 160 may comprise a plurality of elongated lamps or can comprise a plurality of linear lamps.

In the embodiment illustrated in FIG. 1, the lamps 160 are placed below the semiconductor water 114. It should be understood, however, that the light sources may also be placed on the side of the chamber or can be placed above the chamber so that light directly contacts the thin film layer being treated. In other embodiments, lamps can be placed both above and below the wafer, below the wafer and on the side of the wafer, above the wafer and on the side of the wafer, or can be placed below the wafer, above the wafer, and on the side of the wafer.

The use of light sources to produce rapid thermal cycles is generally preferred. For instance, lamps or light sources have much higher heating and cooling rates than other heating devices. Lamps create a rapid thermal processing system that provide instantaneous energy, typically requiring a very short and well controlled start-up period. The flow of energy from the lamps can also be abruptly stopped at any time. The lamps can be equipped with gradual power controls and can be connected to a controller that automatically adjusts the amount of light energy being emitted by the lamps based upon temperature measurements of the wafer.

The temperature of the wafer during processing, can be monitored using any suitable temperature measurement device. In one embodiment, for instance, the temperature of the wafer can be determined using pyrometers that measure the temperature of the wafer without contacting the wafer.

For instance, the system of the present disclosure can include a plurality of optical fibers or light pipes which are, in turn, in communication with a plurality of light detectors. The amount of sensed radiation is then communicated to the light detectors which generate a usable voltage signal for determining the temperature of the wafer which can be calculated based, in part, on Planck's Law.

In general, the system can contain one or a plurality of pyrometers. When containing a plurality of pyrometers, each pyrometer can measure the temperature of the wafer at a different location. Knowing the temperature of the wafer at different locations can then be used to control the amount of heat being applied to the wafer. For example, in one embodiment, the system can include a controller, such as a microprocessor. The controller can receive voltage signals from the light detectors that represent the radiation amounts being sampled at the various locations. Based on the signals received, the controller can be configured to calculate the temperature of the wafer at the different locations. The controller can also be in communication with the light energy sources 160. In this manner, the controller can determine the temperature of the wafer, and, based on this information, control the amount of thermal energy being emitted by the lamps 106. Consequently, instantaneous adjustments can be made regarding the conditions within the thermal processing chamber. Alternatively, instead of a close loop system as described above, the controller may operate on an open loop system. For instance, the controller can be calibrated using the temperature sensing devices and then preprogrammed to operate the light sources based on predicted results.

As shown in FIG. 1, the light energy sources 160 can be isolated from the thermal processing chamber 110 by a spectral filter or a window 162. The spectral filter 162 serves to isolate the lamps 160 from the semiconductor wafer 114 and prevent contamination of the chamber. Spectral filter 162 is designed to allow thermal energy from the lamps to pass through and into the chamber for heating the semiconductor wafer 114. In one embodiment, the spectral filter 162 may filter out light at a certain wavelength, such as the wavelength at which the pyrometers operate in order to prevent interference. The spectral filter 162, for instance, can be made from quartz or other similar material.

As described above, the semiconductor wafer 114 is placed on a substrate holder 112. In one embodiment, the substrate holder 112 can be adapted to rotate the wafer during processing. Rotating the water promotes greater temperature uniformity over the surface of the wafer and promotes enhanced contact between the wafer and the reactive species introduced into the chamber. In other embodiments, however, the semiconductor wafer 114 may remain stationary during processing.

The system illustrated in FIG. 1 further includes an outlet 164. Outlet 164 is for allowing gases to flow through the chamber and exit the chamber. In one embodiment, for instance, the reactive species that does not react with the surface of the wafer can flow into the thermal processing chamber 110 and exit through the outlet 164. After an etch process is completed, in one embodiment, any inert gas can be fed through the chamber and out through the outlet 164 in order to remove all reactive species from within the processing chamber.

In conducting a controlled etch process in accordance with the present disclosure, a plasma is first generated in the plasma chamber 120 from an etchant gas to produce a reactive species. The etchant gas may comprise a single gas or may comprise a mixture of gases. The composition of the etchant gas, for instance, can depend upon numerous variables. For instance, selection of the etchant gas can depend upon a film layer contained on a semiconductor wafer 114 to be etched, the etch conditions, and the amount of material to be etched off the surface of the wafer. Gases that may be used to formulate the etchant gas include, for instance, an oxygen source, a hydrogen source, a halogen source, and the like. Particular gases that may be used include molecular oxygen, molecular nitrogen, argon, molecular hydrogen, water, hydrogen peroxide, carbon dioxide, sulfur dioxide, methane, carbonyl sulfide, trifluoromethane, tetrafluoromethane, and the like, or mixtures thereof.

In one embodiment, for instance, the etchant gas may comprise an oxygen containing gas alone or in combination with an inert gas, such as nitrogen. For instance, in one particular embodiment, the etchant gas may comprise a combination of molecular oxygen and molecular nitrogen.

In an alternative embodiment, the etchant gas may comprise a combination of an oxygen containing gas, a halogen containing gas, and a reducing gas. The oxygen containing gas, for instance, may comprise molecular oxygen, carbon dioxide, carbon monoxide, nitric oxide, or combinations thereof. The halogen containing gas, for instance, can contain fluorine such as tetrafluoromethane. The reducing gas, on the other hand, can contain hydrogen and may comprise molecular hydrogen, ammonia, methane, or the like. An inert gas may also be present, such as molecular nitrogen, or a noble gas such as argon or helium.

The gas flow rate can vary widely depending upon the particular application. For instance, each gas can have a flow rate of from about 50 sccm to about 20,000 sccm, such as from about 500 sccm to about 10,000 sccm.

The etch process of the present disclosure can also be carried out at varying power and pressure levels. The RF source power, for instance, can range from about 300 watts to about 6,000 watts, such as from about 1,000 watts to about 5,500 watts, such as from about 3,000 watts to about 5,000 watts. The source power can be adjusted up or down based on the surface area of the semiconductor wafer to be treated. The pressure within the processing chamber, on the other hand, can also vary depending upon various different factors. The pressure for instance, can range from about 1 mTorr to about 4,000 mTorr, such as from about 250 m/Torr to about 1,500 mTorr, such as from about 400 m/Torr to about 600 m/Torr.

Each of the above different parameters can be controlled in order to control the etch rate during processing of the film layer on the semiconductor wafer. The etch rate is also carefully controlled by controlling the temperature increase through the rapid thermal cycles. More particularly, the etch rate can depend upon the thin film being processed, the etchant gas composition, the gas flow rates, the temperature of the film layer, the pressure within the chamber, in addition to various other factors. In general, the etch rate can be greater than about 100 angstroms per minute, such as greater than about 200 angstroms per minute, such as greater than about 300 angstroms per minute, such as greater than about 400 angstroms per minute, such as greater than about 500 angstroms per minute, such as greater than about 600 angstroms per minute, such as greater than about 700 angstroms per minute, such as greater than about 800 angstroms per minute, such as greater than about 900 angstroms per minute, such as greater than about 1,000 angstroms per minute, such as greater than about 1,200 angstroms per minute, such as greater than about 1,400 angstroms per minute, such as greater than about 1,600 angstroms per minute, such as greater than about 1,800 angstroms per minute, such as greater than about 2,000 angstroms per minute. The etch rate is generally less than about 70,000 angstroms per minute, such as less than about 50,000 angstroms per minute, such as less than about 40,000 angstroms per minute, such as less than about 30,000 angstroms per minute, such as less than about 20,000 angstroms per minute, such as less than about 10,000 angstroms per minute, such as less than about 9,000 angstroms per minute, such as less than about 8,000 angstroms per minute, such as less than about 7,000 angstroms per minute, such as less than about 6,000 angstroms per minute, such as less than about 5,000 angstroms per minute, such as less than about 4,000 angstroms per minute, such as less than about 3,000 angstroms per minute, such as less than about 2,000 angstroms per minute, such as less than about 1,000 angstroms per minute.

In general, any suitable film layer can be etched in accordance with the present disclosure. Film layers while suited for use in the present disclosure, for instance, include film layers than when exposed to a reactive species, such as a reactive species produced by a plasma (i.e. neutral particles), have a activation temperature of generally greater than about 30° C., such as greater than about 40° C., such as greater than about 50° C., such as greater than about 60° C., such as greater than about 70° C., such as greater than about 80° C., such as greater than about 90° C., such as greater than about 100° C. Such film layers include film layers containing carbon. For example, in one embodiment, the film layer being etched in accordance with the present disclosure comprises an amorphous carbon layer. The amorphous carbon layer, for instance, can be doped with boron.

In other embodiments, the carbon containing layer can comprise a photoresist layer.

The process of the present disclosure is also well suited to etching film layers having a low dielectric constant.

Figure 4:
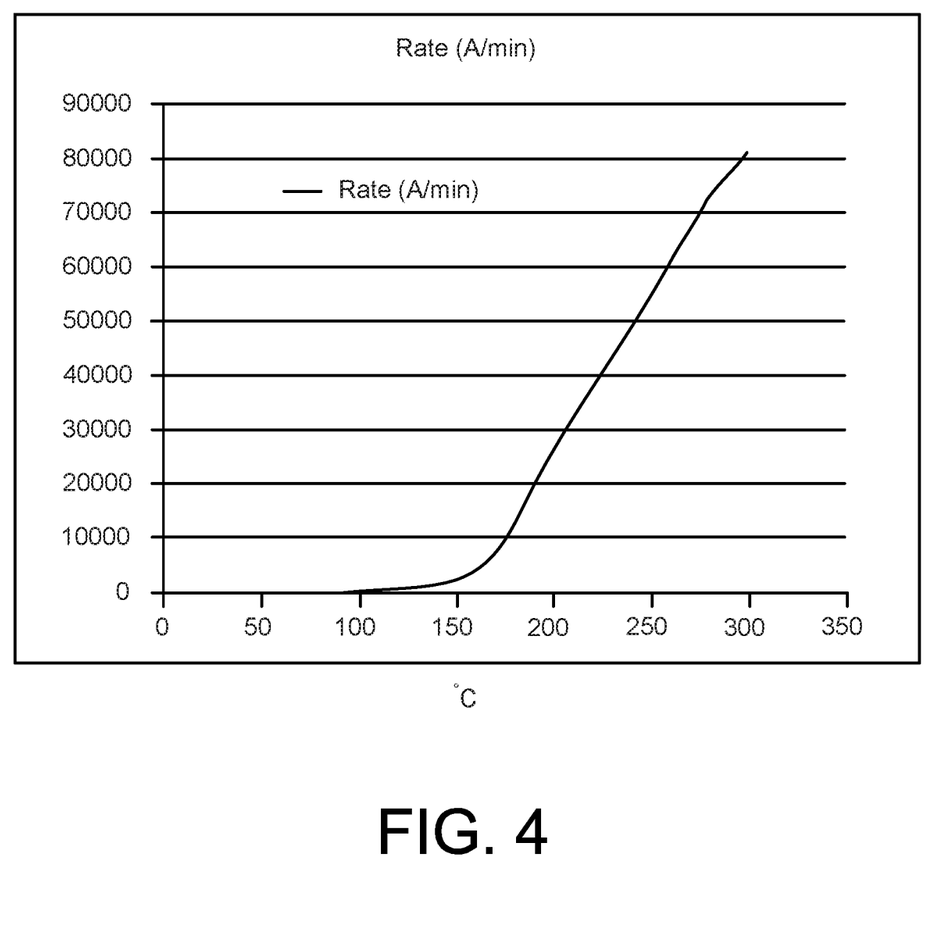
FIG. 4 is a graph illustrating one embodiment of the relationship between temperature and etch rate when a layer is exposed to a reactive species.

For purposes of explanation, for instance, included as FIG. 4 is a graph illustrating etch rate versus temperature when exposed to an etching gas for a carbon containing film, such as a photoresist layer. For instance, FIG. 4 can represent an embodiment where a photoresist layer containing carbon is subjected to an etch process in the presence of a reactive species produced from molecular oxygen and molecular nitrogen plasma. As shown, etching does not occur until the temperature of the film layer reaches generally greater than about 80° C., even in the presence of oxygen reaction reticles. In accordance with the present disclosure, rapid thermal heating cycles are used in order to incrementally increase the temperature of the film layer and the wafer in a manner for controlling the etch rate during the process.

Figure 3:
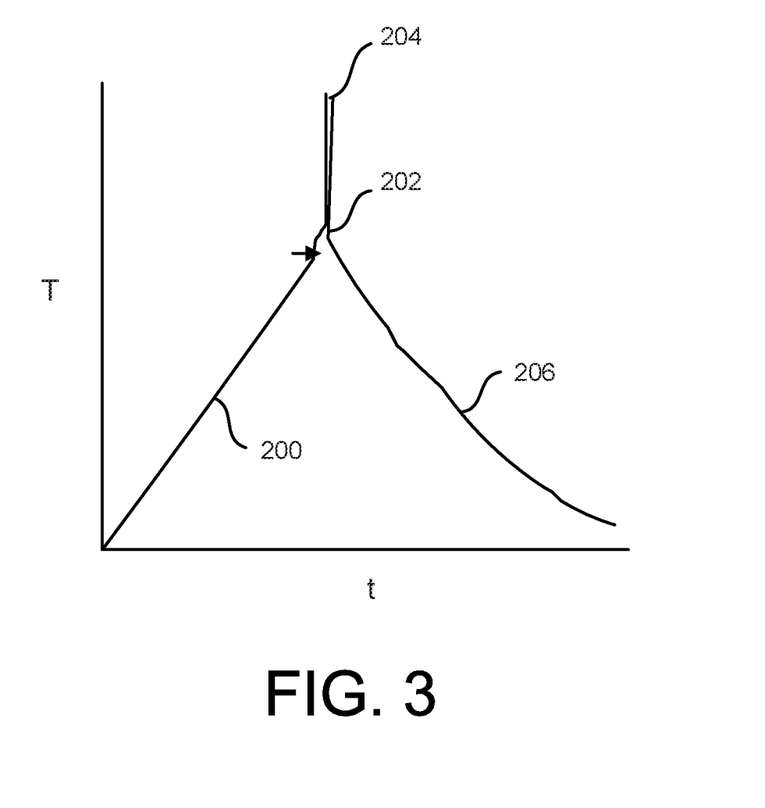
FIG. 3 is a graph illustrating one embodiment of a temperature profile that may occur during the present disclosure.

Referring to FIG. 3, for instance, one embodiment of a temperature control profile that may be used during an etch process of the present disclosure is shown. Referring to FIG. 3, for instance, the temperature of the film layer increases at area 200. Area 200 represents bulk heating of the wafer and the film layer. The activation temperature of the reaction between the film layer and the reactive species occurs at temperature 202 on the graph. In accordance with the present disclosure, rapid thermal cycles are then used to increase the temperature from the activation temperature 202 to a maximum temperature 204. Using rapid thermal cycles, the temperature of the film layer can be increased to the maximum temperature 204 and then immediately reduced back down to the activation temperature 202. For instance, each temperature cycle can comprise a pulse of the light energy sources. Each pulse can be extremely short in order to control a reactive removal amount during the etch process. For instance, each thermal pulsing cycle of lamps can be less than about 10 seconds, such as less than about 7 seconds, such as less than about 5 seconds, such as less than about 3 seconds, such as less than about 1 second, such as less than about 800 milliseconds, such as less than about 600 milliseconds, such as even less than about 400 milliseconds. Each pulse is generally greater than about 50 milliseconds, such as greater than about 100 milliseconds. After the controlled etch is completed, as shown in FIG. 3, the temperature of the film layer decreases back to an ambient.

Thus, the temperature versus time profile shown in FIG. 3 illustrates how the film layer can be heated to the activation temperature and then rapidly heated to a maximum temperature by flash heating causing a rapid fast temperature ramp increase. After reaching the maximum temperature, the film layer can be rapidly cooled by thermal conduction to bulk. In this manner, an atomic layer etching process can be carried out.

Figure 2:
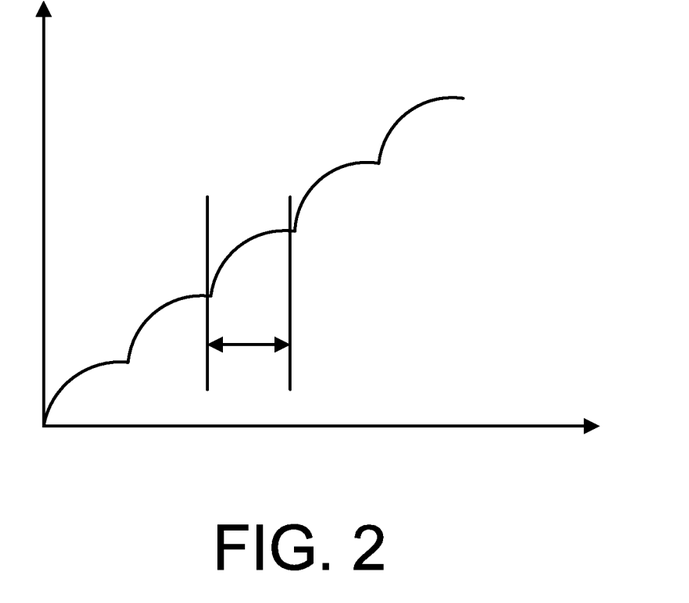
FIG. 2 is a graph illustrating one embodiment of the cumulative etch amount that may occur during the process of the present disclosure.

FIG. 2, illustrates the cumulative etch amount through each thermal pulsing cycle. By using short thermal pulsing, the etch amount can be gradually increased and the reaction can be stopped at the end of each thermal pulsing cycle so the etched amount can be controlled to a very fine resolution. As shown in FIG. 2, for instance, each thermal cycle increases the amount of material etched according curvilinear amount creating an increasing but overall nonlinear etch rate.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A process for etching a layer on a semiconductor wafer comprising:
    placing a semiconductor wafer in a processing chamber, the semiconductor wafer including a film layer;
    generating a plasma from an etchant gas, the plasma containing a reactive species;
    contacting the film layer with the reactive species; and
    exposing the semiconductor wafer to a plurality of thermal cycles while being contacted with the reactive species to etch the film layer;
    wherein at least one surface of the semiconductor wafer comprises the film layer, wherein each of the plurality of thermal cycles is configured to increase a temperature of the at least one surface to reach a first temperature at a first rate, and is further configured to further increase the temperature of the at least one surface to reach a second temperature at a second rate, after reaching the second temperature, each of the plurality of thermal cycles is further configured to cool the at least one surface to a third temperature at a third rate, wherein the second rate is greater than the first rate, the second temperature is greater than the first and third temperatures, wherein the reactive species etches the at least one surface to at least partially remove an amount of the film layer at least at the first and second temperatures;
    wherein the plurality of thermal cycles produces an overall nonlinear etch rate such that each of the plurality of thermal cycles increases an etch amount of the film layer in a curvilinear manner.

2. A process as defined in claim 1, wherein the film layer contains carbon.

3. A process as defined in claim 1, wherein the film layer comprises a dielectric layer having a low dielectric constant.

4. A process as defined in claim 1, wherein each of the plurality of thermal cycles is produced by a plurality of lamps.

5. A process as defined in claim 4, wherein the film layer is exposed to the plurality of thermal cycles, each of the plurality of thermal cycles comprising a pulse of light energy.

6. A process as defined in claim 1, wherein the film layer comprises a photoresist layer or a hardmask layer.

7. A process as defined in claim 1, wherein the film layer comprises an atomic layer.

8. A process as defined in claim 1, wherein each thermal cycle has a cycle time of from 1 ms to about 10 s.

9. A process as defined in claim 1, wherein the etchant gas comprises molecular oxygen, molecular nitrogen, argon, molecular hydrogen, water, hydrogen peroxide, carbon dioxide, sulfur dioxide, methane, carbonyl sulfide, fluoroform (trifluoromethane), tetrafluoromethane, or mixtures thereof.

10. A process as defined in claim 1, wherein the film layer contains amorphous carbon.

11. A process as defined in claim 1, wherein the plasma is generated in a plasma chamber and is fed through a filter structure prior to contacting the film layer.

12. A process as defined in claim 1, wherein the semiconductor wafer is heated to a temperature of from about 100° C. to about 300° C.

13. A process as defined in claim 11, wherein the filter structure includes openings that allow reactive species to pass but filter out at least 65% of charged species contained within the plasma, the reactive species comprising neutral particles.

14. A process as defined in claim 11, wherein the filter structure includes openings that allow reactive species to pass but filter out at least 85% of charged species contained within the plasma, the reactive species comprising neutral particles.

15. A process as defined in claim 1, wherein the first temperature is greater than about 80° C.

16. A process as defined in claim 5, wherein the plurality of thermal cycles have different cycle times.

17. A process as defined in claim 5, wherein the temperature of the semiconductor wafer is increased in a nonlinear manner.

18. A process as defined in claim 1, wherein the reactive species are introduced into the chamber opposite a top surface of the semiconductor wafer and wherein each of the plurality of thermal cycles is produced by a plurality of lamps located below the semiconductor wafer.

\* \* \* \* \*